United States Patent [19]
Ohshima et al.

[11] Patent Number: 5,382,549
[45] Date of Patent: Jan. 17, 1995

[54] METHOD OF MANUFACTURING POLYCRYSTALLINE SILICON HAVING COLUMNAR ORIENTATION

[75] Inventors: Jiro Ohshima, Kitakyushu; Toshiyo Motozima, Yokohama, both of Japan

[73] Assignee: Kabushiki Kaisha Toshiba, Kawasaki, Japan

[21] Appl. No.: 85,139

[22] Filed: Jul. 2, 1993

Related U.S. Application Data

[60] Division of Ser. No. 883,244, May 7, 1992, abandoned, which is a continuation of Ser. No. 610,228, Nov. 9, 1990, abandoned.

[30] Foreign Application Priority Data

Nov. 10, 1989 [JP] Japan ................... 1-293493

[51] Int. Cl.⁶ ........................ H01L 21/469
[52] U.S. Cl. ................... 437/233; 437/24; 437/37; 437/60
[58] Field of Search ........... 437/37, 24, 38, 233, 437/976, 967, 975

[56] References Cited

U.S. PATENT DOCUMENTS

| | | | |
|---|---|---|---|
| 4,035,906 | 7/1977 | Tasch et al. | 437/37 |
| 4,488,162 | 12/1984 | Jambotkar | 357/59 |
| 4,591,893 | 5/1986 | Yamazaki | 357/58 |
| 4,746,621 | 5/1988 | Thomas et al. | 437/37 |
| 4,807,015 | 2/1989 | Kobayashi et al. | 357/67 |

FOREIGN PATENT DOCUMENTS 55-62741  5/1980  Japan ..................... 437/37

Primary Examiner—Olik Chaudhuri
Assistant Examiner—S. Mulpuri
Attorney, Agent, or Firm—Finnegan, Henderson, Farabow, Garrett & Dunner

[57] ABSTRACT

In a semiconductor device, the polysilicon resistor or electrode formed of a polysilicon film has a columnar crystalline orientation vertical to the surface of the semiconductor substrate. Thus, the variation in grain size due to the subsequent heat treatment is small, and therefore, the polysilicon resistor or electrode has a high uniformity of resistance value. In addition, since the polysilicon film is formed in the groove in the insulating film formed on the semiconductor substrate, a polysilicon pattern surface which is flush with the surface of the insulating film can be obtained. Thus, unevenness does not occur on the surface of a passivation CVD film coated in the subsequent step, and metal wires formed thereon are not cut.

2 Claims, 2 Drawing Sheets

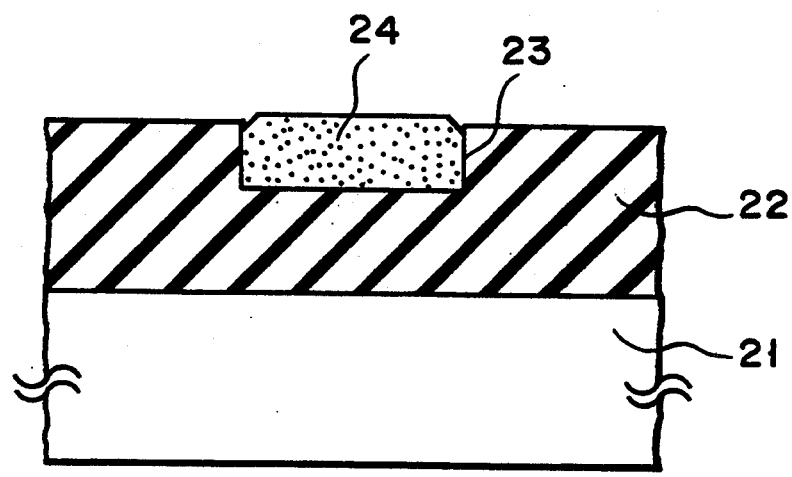
F I G. 2

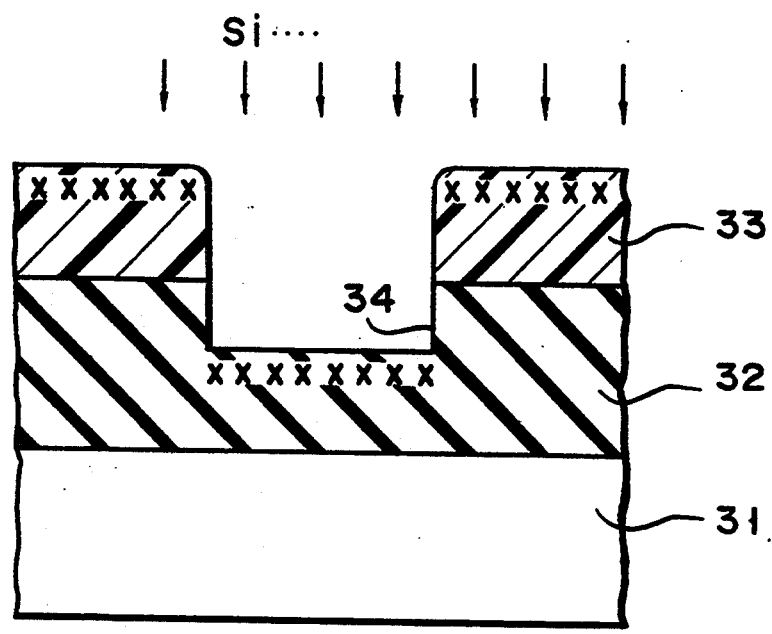
F I G. 3A
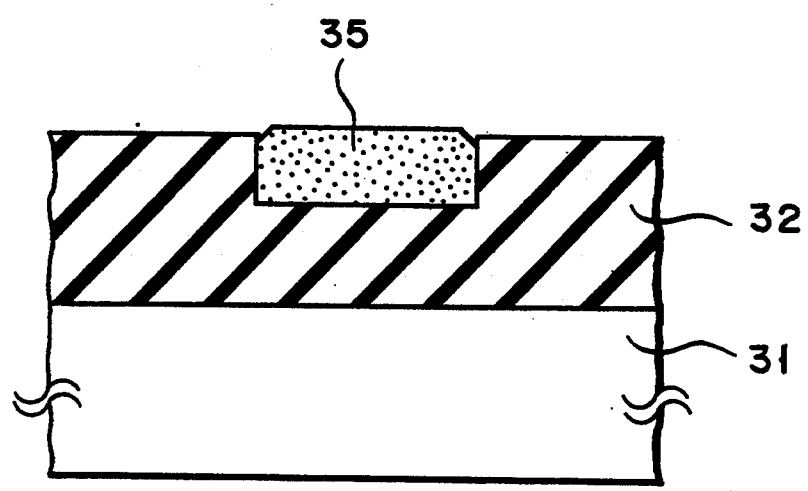
F I G. 3B

METHOD OF MANUFACTURING POLYCRYSTALLINE SILICON HAVING COLUMNAR ORIENTATION

This application is a division of application Ser. No. 07/883,244 filed May 7, 1992, which is a continuation of application Ser. No. 07/610,228, filed Nov. 9, 1990 both abandoned.

BACKGROUND OF THE INVENTION

1. Field of the Invention

The present invention relates generally to a semiconductor device and a method of manufacturing the semiconductor device, and particularly to a technique of forming a polysilicon film of which a polysilicon resistor, an electrode, etc. are made.

2. Description of the Related Art

FIG. 1 shows a structure of a conventional semiconductor device having, for example, a polysilicon resistor.

An insulating film 12 is formed on a semiconductor substrate 11. A polysilicon resistor 13 is formed on the insulating film 12 in a mesa shape. A passivation CVD film 14, for example, is formed on the polysilicon resistor 13.

This semiconductor device is formed by the following method.

First, the insulating film 12 is formed on the semiconductor substrate 11. Then, using a vacuum CVD device, for example, a polysilicon film having a grain size of 0.01 to 0.1 $\mu$m is formed over the entire of a major surface of the substrate 11. The polysilicon film is etched by a selective etching process, thereby obtaining the polysilicon resistor 13 having a desired shape. Further, the passivation CVD film 14, for example, is formed over the entire semiconductor structure.

In the semiconductor device thus manufactured, however, the polysilicon resistor 13 has a mesa shape and therefore the surface of the substrate 11 is uneven. Consequently, metal wires formed on the polysilicon resistor 13 may be cut and the reliability of the product may be degraded.

Further, since the polysilicon resistor 13 is composed of granular crystals, the grain size may vary in a heat treatment step of electrically activating impurities in the polysilicon resistor 13 and in a heat treatment step performed after the formation of the polysilicon resistor 13. As a result, the carrier mobility in the polysilicon resistor 13 varies and the uniformity of the polysilicon resistance is deteriorated.

As has been stated above, in the conventional semiconductor device, since the polysilicon resistor is formed on the insulating film in a mesa shape, metal wires formed on the polysilicon resistor may be cut and the reliability of the product may be degraded. In addition, the grain size may vary in a heat treatment after the formation of the polysilicon resistor, and the uniformity of the resistance is deteriorated.

SUMMARY OF THE INVENTION

The object of the present invention is to provide a semiconductor device and a method of manufacturing the same, wherein a variation in grain size is reduced in a subsequent heat treatment step thereby to obtain a polysilicon resistor having a high uniformity of resistance value, and the surface of a substrate can be flattened.

To achieve this object, this invention provides a semiconductor device wherein a polysilicon resistor or electrode is formed of a polysilicon film having a columnar crystalline orientation vertical to the surface of a semiconductor substrate.

This invention also provides a semiconductor device comprising: a semiconductor substrate; an insulating film formed on the semiconductor substrate; a groove formed in the insulating film; and a polysilicon film formed in the groove and having a columnar crystalline orientation vertical to the surface of the semiconductor substrate.

A method of manufacturing the semiconductor device comprises the steps of: forming an insulating film on a semiconductor substrate; ion-implanting silicon in a predetermined area of the insulating film, thereby forming a silicon nucleus; and forming a polysilicon film only on the area of the silicon nucleus by means of vapor-phase growth, which polysilicon film has a columnar crystalline orientation vertical to the surface of the semiconductor substrate.

According to the above structure, the polysilicon resistor or electrode has a columnar crystalline orientation vertical to the surface of the semiconductor substrate; thus, the variation in grain size due to the subsequent heat treatment is small. Therefore, the polysilicon resistor, electrode, etc. formed of the polysilicon film have a high uniformity of resistance value.

In addition, since the polysilicon film is formed in the groove in the insulating film, a polysilicon pattern surface which is flush with the surface of the insulating film can be obtained. Thus, unevenness does not occur on the surface of a passivation CVD film coated in the subsequent step, and metal wires formed thereon are not cut.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a cross-sectional view showing a semiconductor device according to an embodiment of the invention; and FIGS. 3A and 3B are cross-sectional views illustrating a method of manufacturing the semiconductor device according to the embodiment.

DETAILED DESCRIPTION OF THE PREFERRED EMBODIMENTS

Figure 1:
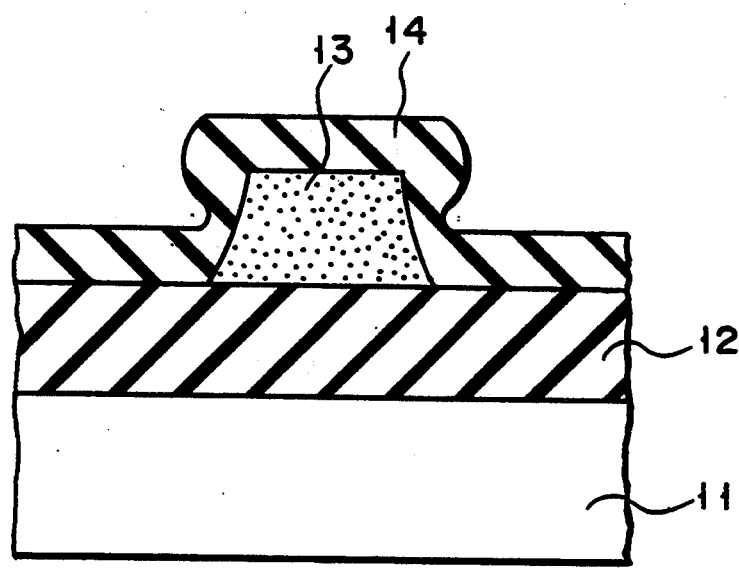
FIG. 1 is a cross-sectional view showing a conventional semiconductor device.

A semiconductor device according to an embodiment of the present invention will now be described with reference to the accompanying drawings.

FIG. 2 shows the semiconductor device according to the embodiment of the invention.

A silicon oxide film 22 is formed on a semiconductor substrate 21. A groove 23 is formed in the silicon oxide film 22. A polysilicon film 24 is formed in the groove 23 such that columnar crystals of the polysilicon film 24 are orientated vertically to the surface of the semiconductor substrate 21. The polysilicon film 24 constitutes a polysilicon resistor, an electrode, etc.

According to this structure, the columnar crystals of the polysilicon film 24 are orientated vertically to the surface of the semiconductor substrate; therefore, the variation of the grain size is reduced in the following heat treatment step. Thus, the resistance values of the polysilicon resistor, electrode, etc., which are constituted by the polysilicon film 24, do not vary greatly among wafers.

Furthermore, since the polysilicon film 24 is formed in the groove 23, the surface of the semiconductor structure is flat. Thus, when a passivation CVD film is coated in a later step, unevenness on the surface of the passivation CVD film does not occur and metal wires formed thereon are not cut.

Referring now to FIGS. 3A and 3B, a method of manufacturing the semiconductor device will now be described in detail.

A silicon oxide film 32 is formed on a semiconductor substrate 31, as shown in FIG. 3A. A resist pattern 33 is formed on the silicon oxide film 32. Then, using the resist pattern 33 as a mask, the silicon oxide film 32 is etched to a depth of about 300 nm by means of RIE (reactive ion etching), thus forming a groove 34. Thereafter, using the same mask, silicon (Si) ions are ion-implanted under the conditions of about 35 kv and $1\times10^{16}$ atoms/cm$^2$, thereby forming a silicon nucleus only on the bottom of the groove 34.

Subsequently, as is shown in FIG. 3B, after the resist pattern 33 is removed, a polysilicon film 35 is grown in a gas atmosphere of, e.g. SiH$_2$Cl$_2$, at a temperature of about 900° C. The polysilicon 35 is grown on the silicon nucleus such that the columnar crystals of the polysilicon film 35 are orientated vertically to the surface of the substrate 31. The polysilicon film 35 does not grow in the area other than the area of the silicon nucleus. In order to form a polysilicon resistor having a polysilicon pattern, which is flush with the surface of the silicon oxide film 32, the polysilicon film 35 is grown to a thickness equal to the depth of the groove 34, i.e. about 300 nm.

The sheet resistance of the polysilicon resistor obtained by the present invention, which has a columnar crystal orientation, was compared with that of a conventional granular polysilicon resistor, after they were subjected to a heat treatment step carried out in an N$_2$ (nitrogen) gas atmosphere for 30 minutes at a temperature of about 950° C. It was found that the sheet resistance of the conventional granular polysilicon resistor varied from about 3 k$\Omega$/□ to about 1.5 k$\Omega$/□, while the sheet resistance of the polysilicon resistor of this invention with the columnar crystalline orientation varied slightly, i.e. from about 1.6 k$\Omega$/□ to about 1.5 k$\Omega$/□ (in the case of a polysilicon film doped with B$^+$ with about 40 kV and $3\times10^{14}$ atoms/cm$^2$). It follows that the variation of polysilicon resistors obtained by the present invention is small among wafers.

The above embodiments of the present invention were directed to the polysilicon resistor; however, this invention is applicable to a polysilicon electrode.

As has been described above, the semiconductor device and the method of manufacturing the same according to the present invention can bring about the following advantages.

Since the polysilicon film has a columnar crystalline orientation vertical to the surface of the semiconductor substrate, the variation in grain size due to the subsequent heat treatment is small. Thus, the polysilicon resistor, electrode, etc. formed of the polysilicon film have a high uniformity of resistance value and a low variation among wafers.

In addition, since the polysilicon film is formed in the groove to obtain a flat surface of the resultant structure, unevenness does not occur on the surface of a passivation CVD film coated in the subsequent step, and metal wires formed thereon are not cut.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, said method comprising the steps of:
   forming an insulating film made of a single composition on a semiconductor substrate;
   ion-implanting silicon in a given area of said insulating film, thereby forming a silicon nucleus; and
   forming a polysilicon film only on the area of the silicon nucleus by means of vapor-phase growth, said polysilicon film having a columnar crystalline orientation vertical to the surface of the semiconductor substrate.

2. A method of manufacturing a semiconductor device, said method comprising the steps of:
   forming an insulating film on a semiconductor substrate:
   forming a resist pattern on said insulating film;
   etching a given area of said insulating film, using said resist pattern as a mask, to form a groove in said given area of the insulating film;
   ion-implanting silicon in said given area of the insulating film, using said resist pattern as a mask, to form a silicon nucleus on the bottom of said groove;
   forming a polysilicon film only on the area of the silicon nucleus by means of vapor-phase growth, said polysilicon film having a columnar crystalline orientation vertical to the surface of the semiconductor substrate.

* * * * *

UNITED STATES PATENT AND TRADEMARK OFFICE
CERTIFICATE OF CORRECTION

PATENT NO. : 5,382,549
DATED : January 17, 1995
INVENTOR(S) : Jiro OHSHIMA et al It is certified that error appears in the above-indentified patent and that said Letters Patent is hereby corrected as shown below:

Claim 1, Column 4, Lines 35 & 36 delete "made of a single composition".

Signed and Sealed this

Sixth Day of June, 1995

Attest:

BRUCE LEHMAN

*Attesting Officer*  *Commissioner of Patents and Trademarks*